(12) United States Patent
Miyahara et al.

(10) Patent No.: US 6,529,375 B2
(45) Date of Patent: Mar. 4, 2003

(54) HEAT SINK UNIT AND ELECTRONIC APPARATUS USING THE SAME

(75) Inventors: Masaharu Miyahara, Nakatsu (JP); Koji Mehara, Usa (JP); Shinji Yoshida, Usa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/978,767

(22) Filed: Oct. 18, 2001

(65) Prior Publication Data
US 2002/0048147 A1 Apr. 25, 2002

(30) Foreign Application Priority Data

Oct. 19, 2000 (JP) ........................................ 2000-319027

(51) Int. Cl.[7] ................................................. H05K 7/20
(52) U.S. Cl. ....................... 361/697; 165/121; 252/722; 361/719
(58) Field of Search ................................. 361/687, 695, 361/697, 703, 704, 717–719; 165/121–126, 80.3, 185; 454/184; 415/177, 178, 213.1, 214.1; 312/236; 248/505, 510; 257/718, 719, 726, 727, 722

(56) References Cited

U.S. PATENT DOCUMENTS

| | | | | |
|---|---|---|---|---|
| 5,077,601 A | * | 12/1991 | Hatada et al. | 257/722 |
| 5,630,469 A | * | 5/1997 | Butterbaugh et al. | 165/80.3 |
| 5,946,192 A | * | 8/1999 | Ishigami et al. | 361/704 |
| 6,122,169 A | * | 9/2000 | Liu et al. | 361/700 |
| 6,157,539 A | * | 12/2000 | Wagner et al. | 361/704 |
| 6,169,660 B1 | * | 1/2001 | Sarraf et al. | 361/717 |
| 6,327,148 B1 | * | 12/2001 | Tucker et al. | 361/704 |
| 6,328,097 B1 | * | 12/2001 | Bookhardt et al. | 165/104.33 |
| 6,408,934 B1 | * | 6/2002 | Ishida et al. | 165/80.3 |

FOREIGN PATENT DOCUMENTS

| | | |
|---|---|---|
| JP | 6-324570 | 12/1994 |
| JP | 11-92819 | 3/1999 |

* cited by examiner

*Primary Examiner*—Gerald Tolin
(74) *Attorney, Agent, or Firm*—McDermott, Will & Emery

(57) ABSTRACT

A heat sink unit comprising a substrate, a fan, driving means, a fin composed as a separate body from the substrate, and a cover. The cover has a first opening in a section facing the fan, and also forms a second opening with the substrate at one side of the cover. The fin is composed of a separate material from the substrate, and fixed to an opening provided in the substrate. A height from a bottom surface of a heat sink substrate to an upper surface of a cover at a section the fin is disposed is larger than that at a section where the fan is disposed. A thickness of a base of the fin is larger than a thickness of the heat sink substrate. Furthermore, an electronic apparatus of this invention has a heat sink unit of this invention disposed within the apparatus.

23 Claims, 7 Drawing Sheets

HEAT SINK UNIT AND ELECTRONIC APPARATUS USING THE SAME

BACKGROUND OF THE INVENTION

1. Field of the Invention

The present invention relates to a heat sink unit for cooling semiconductor devices such as IC, LEI, MU, and the like and electronic components. The invention also relates to an electronic apparatus using the same.

2. Description of the Prior Art

FIG. 7 is a plan view showing a heat sink unit of the prior art, and FIG. 8 is a cross sectional view also showing the heat sink unit of the prior art. In FIG. 7 and FIG. 8, the conventional heat sink unit comprises a heat sink substrate 1, a motor 2 disposed on the heat sink substrate 1, a fan 3 rotated by the motor 2, an intake opening 5 formed in a cover 4, an exhaust opening 6 for blowing out a gas flow into one direction, and a fin 7 disposed to the heat sink substrate 1 for dissipating heat.

The heat sink unit constructed as above is attached to a semiconductor device such as MPU mounted in a computer, and the like, to dissipate heat generated by the MPU, so as to prevent the MPU from falling into thermal runaway and the like failure.

However, amount of heat generated by the semiconductor devices such as MPU is increasing by a improvement of their performance. There were such problems as larger noises due to an interaction of the fan 3 with air when rotation speed of the motor 2 is increased in an attempt to improve cooling effect, and a cooling efficiency remains low because an amount of air-flow does not increase so much even when the motor 2 is rotated at a high speed.

This is attributed to the structure in that the fan 3 draws air from a side of the cover 4, and blow out the air through the exhaust opening 6 located in a direction generally orthogonal to the incoming air flow. For this reason, the MPU could not be cooled sufficiently, a gas circulation within an enclosure was poor, and it was difficult to lower a temperature within the enclosure.

The present invention addresses the problems described above, and it aims to provide a heat sink unit having outstanding cooling performance and an electronic apparatus using the heat sink unit.

SUMMARY OF THE INVENTION

A heat sink unit of the present invention comprises:
a substrate;
a fan for supplying a gas flow to the substrate;
driving means for rotating the fan;
a fin composed as a separate body from the substrate and attached to the substrate; and
a cover providing a space between the substrate and the cover and attached to the substrate,
wherein the fan, the driving means and the fin are arranged within the space, the cover has a first opening in a section facing the fan, and
the substrate and the cover form a second opening at a side next to the fin.

In the heat sink unit of the present invention, an opening for mounting the fin is provided in the substrate between the fan and the second opening, and the fin composed of a material different from the substrate material is attached to the opening in the substrate.

Furthermore, a heat sink unit in another embodiment of this invention is so constructed that a height from a bottom surface of the substrate to an upper surface of the cover at a section where the fin is disposed is higher than that at another section where the fan is mounted, and that a thickness of a base of the fin is larger than a thickness of the substrate.

In addition, an electronic apparatus of the present invention has a heat sink unit of the present invention disposed within the apparatus.

With the structure, the present invention can provide the heat sink unit and the electronic apparatus having large cooling performance.

BRIEF DESCRIPTION OF THE DRAWINGS

The accompanying drawings, which are incorporated in and form a part of the specification, illustrate exemplary embodiments of the present invention and, together with the description, serve to explain the principles of the invention. In the drawings.

DESCRIPTION OF THE PREFERRED EMBODIMENTS

Exemplary embodiments of the present invention will be described hereinafter.

First Exemplary Embodiment

Figure 1B:
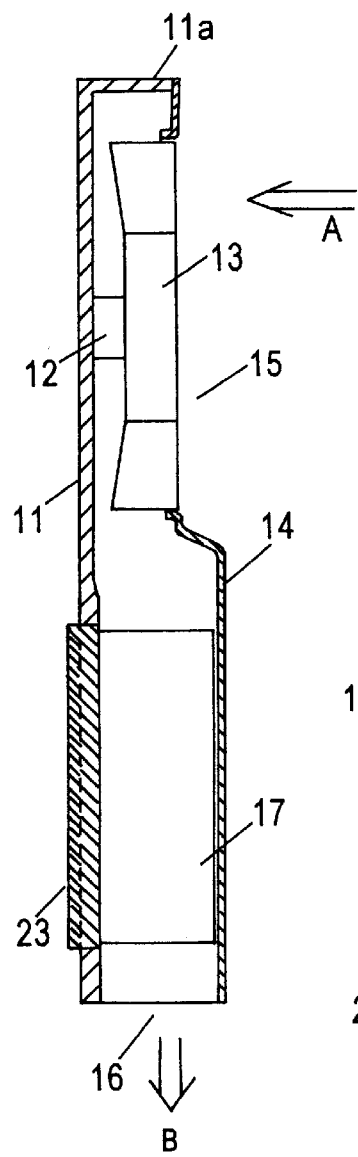
FIG. 1A is a plan view and FIGS. 1B and 1C are sectioned side views showing a heat sink unit according to an exemplary embodiment of the present invention.
Figure 1A:
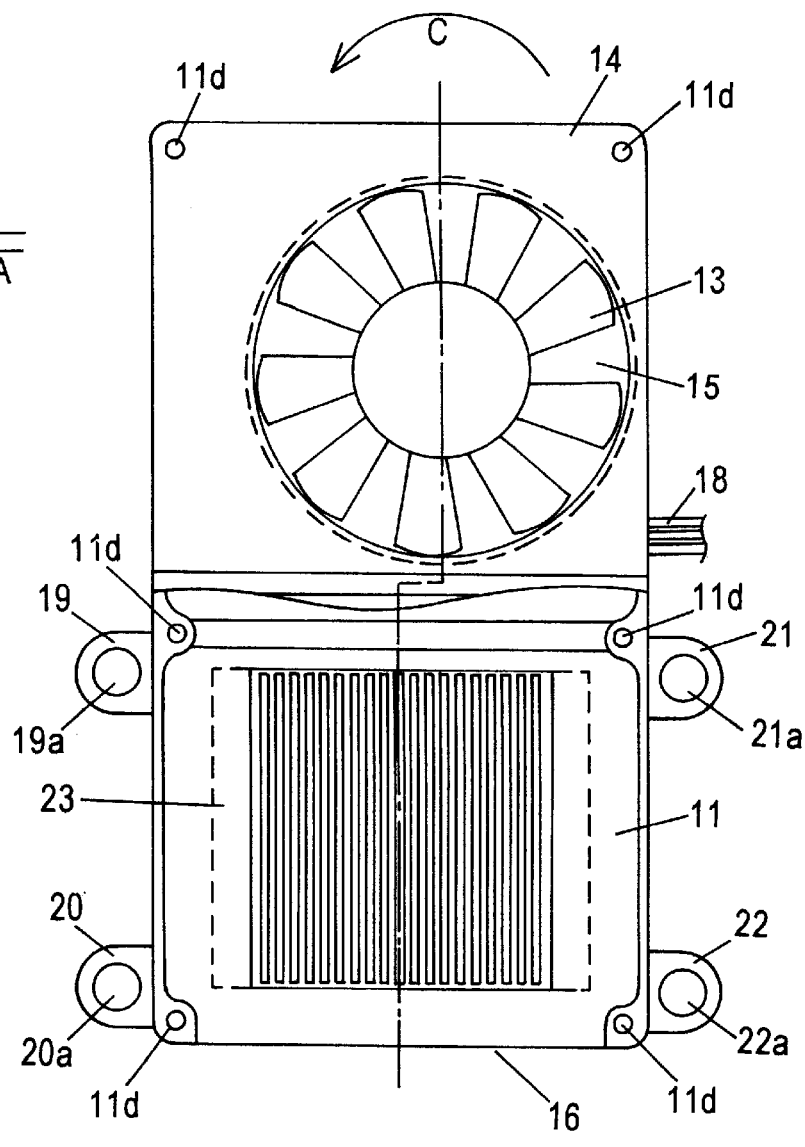
Figure 1C:
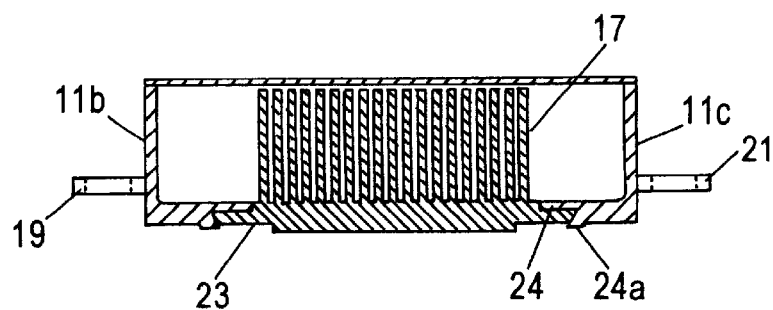

FIG. 1A is a plan view and FIGS. 1B and 1C are sectioned side views showing a heat sink unit according to an exemplary embodiment of the present invention.

The heat sink unit of the present invention comprises substrate 11 and fan 13 disposed on the substrate 11, and the fan 13 is generally rotated by driving means such as a motor. In the present exemplary embodiment, the fan 13 is mounted to and rotated by motor unit 12, which is provided with a coil and a magnet, for instance, although not shown in the figure.

The substrate 11 has a cover 14 mounted either directly or indirectly to it. The cover 14 is provided with an opening 15 in a section facing the fan 13. This opening 15 is used mainly as an air intake opening.

An efficiency of heat dissipation can be improved further by providing the substrate 11 with fin unit 17, which has one or more vertically formed fins. In the heat sink unit of the present invention, the fin unit 17 is composed of a different material from that of substrate 11. It is desirable that a material, size, number of fins, and the like of the fin unit 17 are arranged according to the required heat dissipation performance.

Instead of the fins, ridges and ditches may be made by forming grooves and the like in an area of the substrate 11 where it faces the fan 13.

An electric power is supplied to the motor unit 12 for rotating the fan 13 through lead wire 18.

The substrate 11 is provided with side walls 11a, 11b and 11c unitarily formed at ends of the substrate, excluding one side, and the cover 14 is placed in contact with these side walls 11a, 11b, and 11c. An opening formed between the substrate 11 at the end not provided with a side wall and the cover 14 serves as an exhaust opening 16.

The substrate 11 is provided with mounting tabs 19, 20, 21 and 22, having holes 19a, 20a, 21a and 22a respectively, which are used when the substrate 11 is mounted to a circuit board or the like. In addition, the substrate 11 is also provided with caulking studs 11d at six locations for mounting the cover 14 to the substrate 11. The mounting tabs 19, 20, 21 and 22 are provided in a manner to encircle a mounting opening of the fin unit 17 (to be described later), and to protrude from the substrate 11.

In addition, the substrate 11 is also provided with opening 23, which serves as the mounting space for the fin unit 17. The opening 23 is formed in the heat sink substrate 11, between the fan 13 and the exhaust opening 16.

As the fan 13 rotates, gas entered along a direction of A is expelled from the exhaust opening 16 toward an orthogonal direction of B.

By providing the opening 23 in the bottom of the substrate 11 to mount the fin unit 17 made of different material from the substrate 11, a suitable material can be selected according to the heat dissipation characteristic. This is in contrast to the prior art in which a whole structure is molded unitarily with a same material. It also makes possible to change appropriately and easily a number, size, thickness, in-between spacing, and the like of the fin unit according to the heat dissipation characteristic, thereby making it adaptable easily and properly to a numerous variety of demands. In addition, it can also simplify a structure of metal mold used for production of the fin unit.

In this exemplary embodiment, although the fin unit 17 is described as being composed of different material from the substrate 11, the same material as the substrate 11 may be used depending on a particular use.

For the heat sink unit constructed as above, individual elements will be described now in detail.

At first the substrate 11 is explained.

It is suitable to use a substrate 11 having such an outer shape as rectangle and polygon, or a semi-circular shape at one side that faces the fan 13. The substrate of a suitable shape can be selected according to an area for mounting the heat sink unit, arrangement of components around it, and a structure of gas passage, without limiting to the shapes described above.

By selecting polygon for the outer shape, for instance, the heat sink unit can easily be mounted onto a semiconductor device and the like, making good use of any of the external corners as a guide. Or, since semiconductor device such as MPU generally has an outer shape of quadrangle, the heat sink unit can be mounted to the semiconductor device in a small space but with a wide contact area by also making the outer shape of the fin unit 17 quadrangle. The structure also improves the heat dissipation.

Materials that can be used to comprise the substrate 11 include any metallic material selected from the group consisting of zinc, aluminum, brass, gold, silver, tungsten, copper, beryllium, magnesium, and molybdenum (hereinafter referred to as a group of materials), an alloy made of a plurality of materials chosen from the group of materials, an alloy comprising at least one material selected from the group of materials and at least one material not included in the above group of materials, and the like. In the present exemplary embodiment, in consideration of workability and cost advantage, the substrate 11 is composed of pure aluminum, aluminum alloy with at least one material chosen from the above group of materials, aluminum alloy with at least one material selected from those other than the above group of materials, or the like.

In the present exemplary embodiment, although the substrate 11 is composed of a single kind of metallic material, it may be composed by laminating a plurality of sheets of thermally conductive materials. For example, a sheet, a foil, a thin film, and the like of good conductive material such as copper, graphite sheet, and the like may be laminated at least to a lower surface of the heat sink substrate 11.

Although the side walls 11a, 11b and 11c are constructed unitarily with the substrate 11, separate members may be attached to the substrate 11 by press-fit, adhesion, securing with screw, or the like means. Since the substrate 11 can be made substantially flat by employing such a process, the productivity of the substrate 11 can be improved, and a sharing of the component becomes possible.

In the present exemplary embodiment, a height of the side walls 11b and 11c corresponding to a mounting area of the fin unit 17 is made higher by 1.5 to 2.0 times than that of the side walls corresponding to the area where the fan 13 is disposed, as shown in the sectioned side view of FIG. 1B. In this way, a volume of exhaust gas is increased and effect of heat dissipation is improved by increasing height of the side walls next to the fin unit 17. The side walls at a boundary between the areas corresponding to locations of the fin unit 17 and the fan 13 are continuously sloped. However, the side walls may be made equal in height throughout their lengths depending on a condition of the space where the heat sink unit is disposed, or other relevant conditions.

A thickness of the substrate 11 in an area around the opening 23 for mounting the fin unit 17 is larger than a thickness of the substrate 11 in a mounting area for the motor unit 12, so as to improve an efficiency of receiving and conduction of the heat. In the present exemplary embodiment, the thickness of the substrate 11 in the area around the opening 23 is increased by 1.5 to 2.0 times that of the mounting area of the motor unit 12.

Figure 2A:
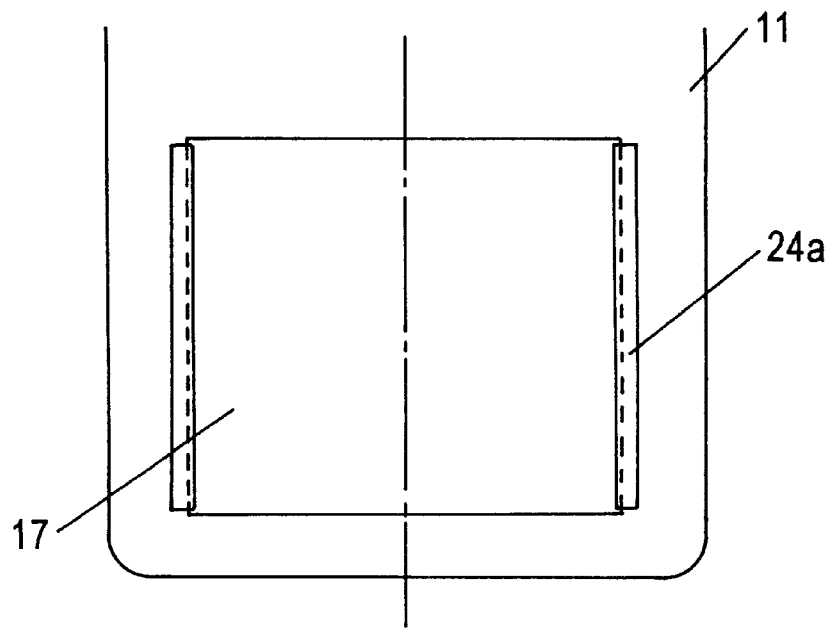
FIG. 2A is a bottom view showing a portion of the heat sink unit where a fin is mounted according to the exemplary embodiment of the invention.
Figure 2B:
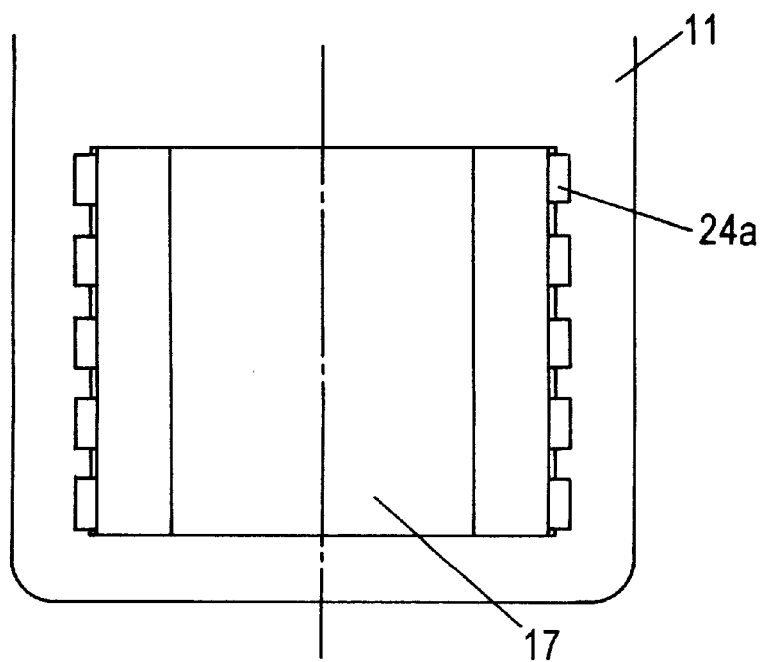
FIG. 2B is a bottom view showing another example of the portion of the heat sink unit where a fin is mounted.

Square shaped opening 23 is provided with engage portions 24 in its two opposite sides for fixing the fin unit 17. The engage portions 24 have recessed portions at an outside of the bottom surface of the substrate 11, into which fitting end surfaces (to be described later) of the fin unit 17 are engaged and fixed. Protrusions 24a are provided along the engage portion 24 for engaging and swaging the fin unit 17. FIGS. 2A and 2B are bottom views, each showing the fin mounting portion of the heat sink unit in the first exemplary embodiment of the present invention. As shown in FIGS. 2A and 2B, the fin unit 17 can be caulked over an entire length of the two opposite sides, or with a plurality of points. In the present exemplary embodiment, although the fin unit 17 was caulked at two sides, it could be caulked at three sides or four sides, or it may be fixed with welding, brazing, adhering, and the like.

Next, the fan 13 is explained.

Protrusions (not shown in the figure) are provided, for instance, on the substrate 11, and the motor unit 12 is mounted to the substrate 11 using the protrusion, as shown in FIG. 1, by insertion, press-fit, adhering, and the like. The fan 13 (propeller type is desirable) is attached to the motor unit 12. In this structure, rotation of the motor unit 12 renders the fan 13 to rotate. An electric motor having a coil and a magnet, an ultrasonic motor, and the like may be used as the motor unit 12. Besides, the fan 13 may desirably be made using such material as plastics in order to save weight. Or, the fan 13 may be made of a thermally conductive material such as metal to further improve the efficiency of heat dissipation, because heat from the substrate 11 is conducted to the fan 13 through the motor unit 12. The fan may be of any type such as a centrifugal fan and the like selected according to characteristic and function of the heat sink unit, without limiting to the propeller type.

The fan 13 performs a cooling function by drawing gas such as air in the surrounding environment, and blows it to the substrate 11 or to the fin unit 17. The gas described here refers to any kind of gas existing around the fan 13, and is not limited to air. For example, the gas may mean nitrogen gas or other kinds of inert gas when nitrogen gas or the other inert gas, or the like exists in the environment surrounding the fan 13.

Further, vibration of the motor unit 12 during rotation can be suppressed by employing a fluid bearing, in particular, for the bearing in the motor unit 12, so as to reduce noise due to the vibration and to control breakdown and the like failure of junctions in the semiconductor device.

The present embodied example shown in FIG. 1 provides a low-profile heat sink unit by adopting direct mounting of the motor unit 12 to the substrate 11. However, the fan can be suspended, for instance, by mounting the motor unit 12 to the cover 14, although not illustrated in the figure. The structure constructed in this way can prolong a service life of the motor unit 12, because it can reduce an influence of thermal damage to the bearing in the motor unit 12, though it tends to increase overall thickness to some extent. If the suspended-type configuration is used, the protrusion becomes unnecessary on the substrate 11, as needless to mention.

The center of a rotary shaft of the fan 13 is apart from the centerline along a longitudinal direction of the substrate 11. It is also apart from the centerline in a lateral direction of the substrate 11 in a manner that a passage of the gas delivered by rotation of the fan 13 expands as it comes closer to the exhaust opening 16. In the present exemplary embodiment, as the fan 13 rotates counterclockwise as shown by a direction of C in FIG. 1, the center of the rotary shaft of the fan 13 is deviated toward the right side. Since this allows the gas to flow smoothly, the cooling efficiency can be improved. Nonetheless, the center of the rotary shaft of the fan 13 may be placed on the centerline along the longitudinal direction of the heat sink substrate 11.

The cover 14 is explained next.

The cover 14 is mounted to the substrate 11 by caulking, as described above, or the like. As an alternative embodiment, it may be bonded to the side walls 11a, 11b and 11c by adhesion or the like means.

The cover 14 is so designed that a height from the bottom surface of the substrate 11 to the upper surface of the cover 14 at the side where the fin unit 17 is mounted is higher than the side where the motor unit 12 is mounted. This increases a cross-sectional area of the gas passage in the space of the fin unit 17, and reduces a resistance to the gas flow, thereby allowing the gas to flow smoothly, and improving the heat dissipation efficiency. In addition, it can ensure a sufficient intake of gas through the opening 15 when the heat sink unit is disposed to an electronic apparatus, even if there are other components in contact to the upper surface of the cover 14 within the electronic apparatus.

Plastics, metal, and the like material are suitably used as a material to form the cover 14. However, it is desirable to compose the cover 14 with a material of high thermal conductivity such as metal in order to increase the efficiency of heat dissipation. In other words, since the heat from a heat-generating component is transferred naturally to the side walls 11a, 11b and 11c, this heat is led to the cover 14, so as to render the cover 14 to dissipate the heat.

In the heat sink unit of the present exemplary embodiment, a significant advantage can be obtained such that it achieve effective heat dissipation, and so on, by using the cover 14, which has the opening 15 serving an intake of gas, to control the gas flow, and to blow the gas sufficiently to the fin unit 17. Depending on an environment and the like of the heat sink unit, however, the cover 14 is not always necessary.

The fin unit 17 is now explained.

Figure 3A:
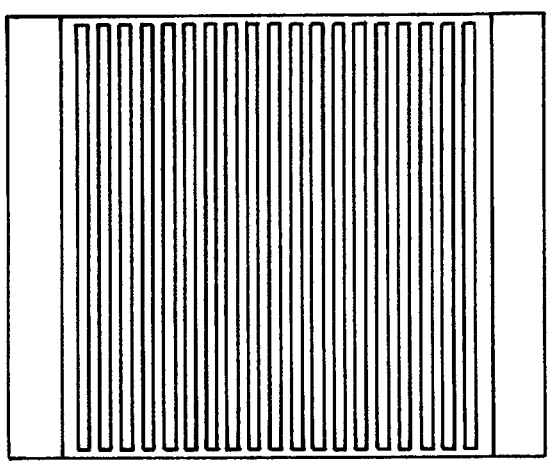
FIG. 3A is a plan view showing a fin of the heat sink unit according to the exemplary embodiment of the present invention.
Figure 3B:
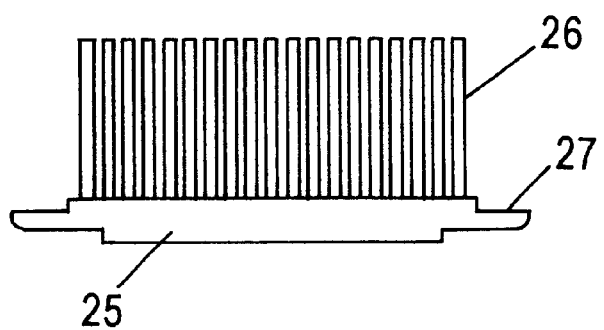
FIG. 3B is a front view showing the fin of the heat sink unit according to the exemplary embodiment of the present invention.
Figure 3C:
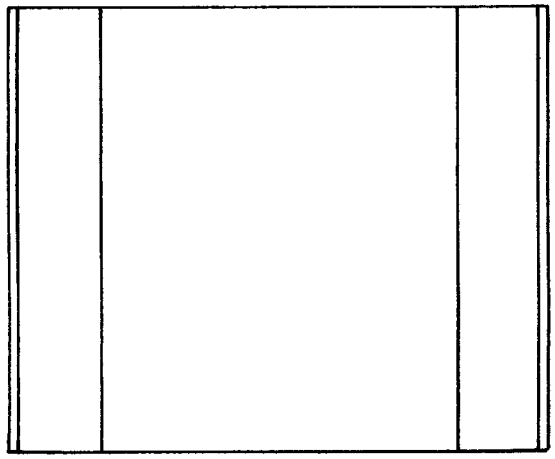
FIG. 3C is a bottom view showing the fin of the heat sink unit according to the exemplary embodiment of the present invention.

FIGS. 3A, 3B and 3C are a plan view, front view and bottom view, respectively showing the fin unit of the heat sink unit in an exemplary embodiment of the present invention. As shown in FIG. 3B, base 25 of the fin unit 17 has a plurality of parallel plate-like fins 26 planted integrally to the base 25. Engage portions 27 provided at two sides of the base 25 are in parallel with a direction of slots of the fins 26. Each end of the base 25 has a step at the side where the fins 26 are planted for engagement to the stepped portions in the engage portions 24 of the substrate 11, thereby the fin unit 17 is caulked and fixed to the substrate 11.

A heat-generating component such as CPU, LSI, IC and the like is mounted to another surface of the base 25 behind which the fins 26 are planted.

Although copper is used as a material of the fin unit 17, any metallic material selected from the group consisting of zinc, aluminum, brass, gold, silver, tungsten, copper, beryllium, magnesium, and molybdenum (hereinafter referred to as a group of materials), an alloy made of a plurality of materials selected from the above group of materials, an alloy comprising at least one material selected from the group of materials and at least one material not included in the above group of materials, and so on, can be used depending on the applications.

Figure 4A:
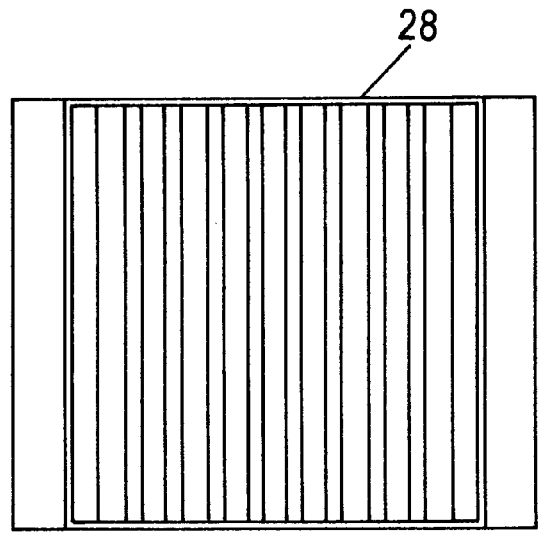
FIG. 4A is a plan view showing another fin of a heat sink unit according to another exemplary embodiment of the present invention.
Figure 4B:
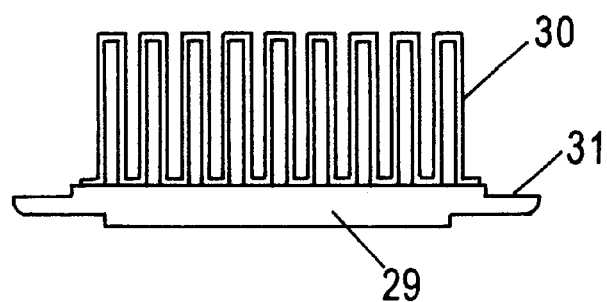
FIG. 4B is a front view showing the fin of the heat sink unit according to the exemplary embodiment of the present invention.
Figure 4C:
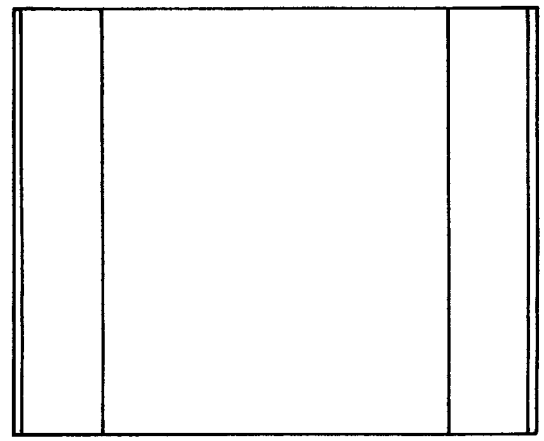
FIG. 4C is a bottom view showing the fin of the heat sink unit according to the exemplary embodiment of the present invention.

FIGS. 4A, 4B and 4C are a plan view, front view and bottom view, respectively showing a fin unit in another exemplary embodiment of the present invention. As shown in FIG. 4B, base 29 of the fin unit 28 is provided with fin 30, which is made of a heat dissipating material formed into a continuous U-fold shape, and one of the folded sides facing the base 29 is fixed to the base 29. The fin 30 is fixed to the base 29 by welding, soldering, adhesion, pressure welding, or the like. Engage portions 31 provided at two sides of the base 29 are in parallel with a direction of slots of the fin 30, and each end of the base 29 has a step at the side where the fin 30 is fixed. The engage portions 31 are engaged to the stepped portions in the engage portions 24 of the substrate 11, caulked, and fixed to the substrate 11. A heat-generating component such as CPU, LSI, IC, and the like is mounted to another surface of the base 29 behind which the fin 30 is fixed.

Component material of the fin unit 28 is same as that used for the fin unit 17.

In this exemplary embodiment, although the engage portions 27 and 31 are provided at two sides in parallel with the direction of the fins, they may be provided at other sides or along an entire periphery. Furthermore, although the fins are formed into plate-like shape, this is not limited to the shape, but they can be of any shape such as a pillar-like shape, pin-like shape, triangle in cross-section, and the like so long as they can achieve the required characteristic.

Described next is the lead wire 18.

The lead wire 18 is provided at its one end with a connector, although not illustrated in the figure, and the lead wire 18 is also connected to the motor unit 12, so as to supply electric power to the motor unit 12 when the connector is connected to a power source, or the like. The lead wire 18 may include a signal line for communicating a detection signal of a sensor (not shown in the figure), which detects a rotational speed of the motor unit 12. In addition, the lead wire 18 may include another signal line for transferring a temperature signal when a temperature sensor (not shown in the figure) is attached to the heat sink substrate 11. The lead wire 18 may be replaced by a flexible printed wiring board or the like, to further reduce the overall thickness. If this is the case, the connector becomes unnecessary.

Second Exemplary Embodiment

Figure 5A:
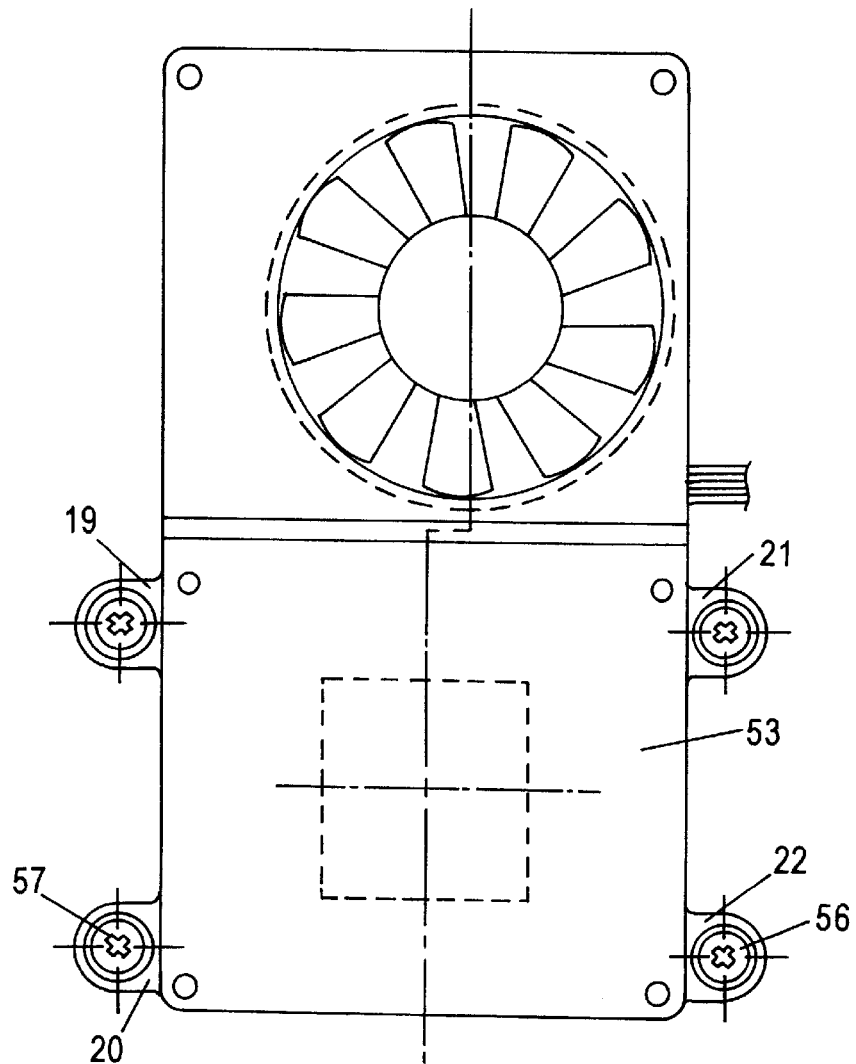
FIGS. 5A and 5B illustrate how a heat sink unit is mounted to a circuit board according to still another exemplary embodiment of the present invention.
Figure 5B:
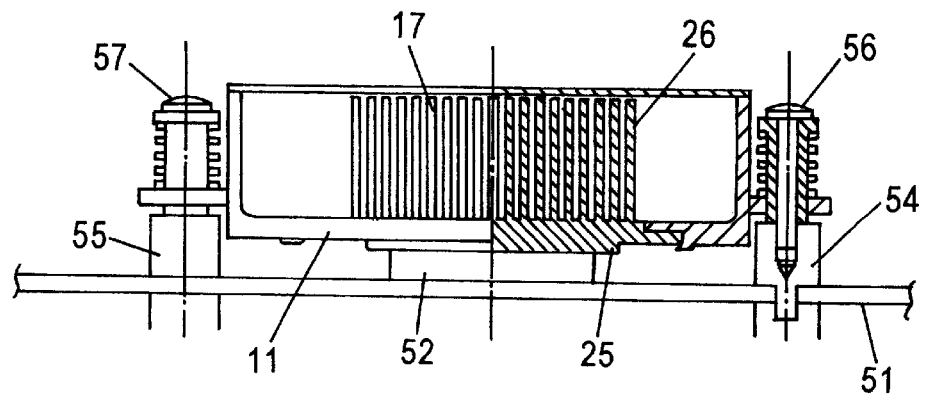
Figure 6:
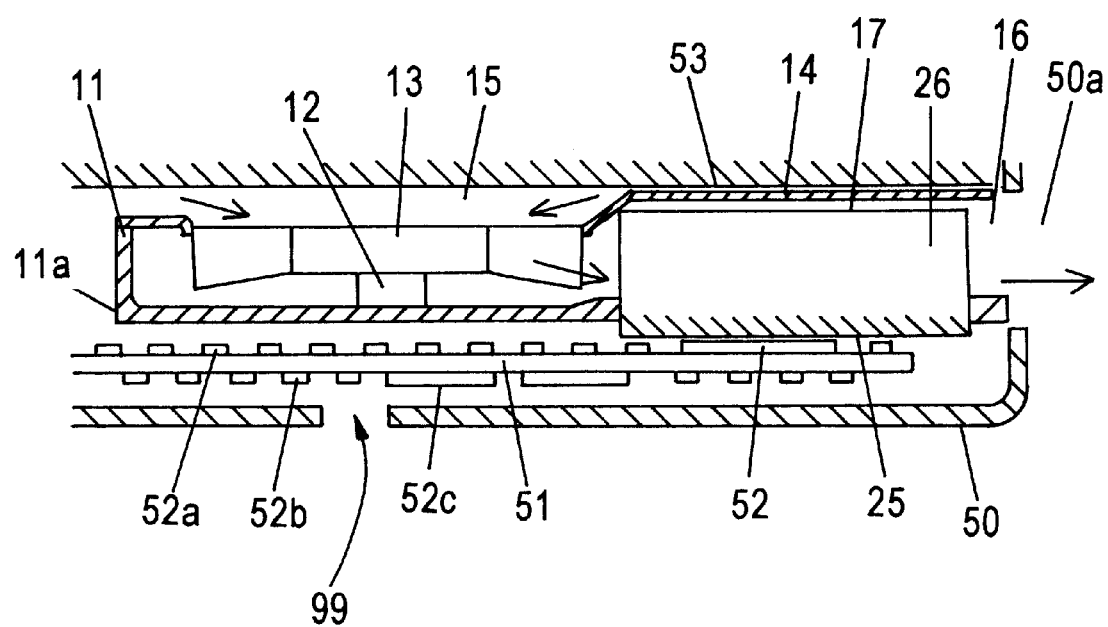
FIG. 6 is a sectional view showing an electronic apparatus according to an exemplary embodiment of the present invention.
Figure 7:
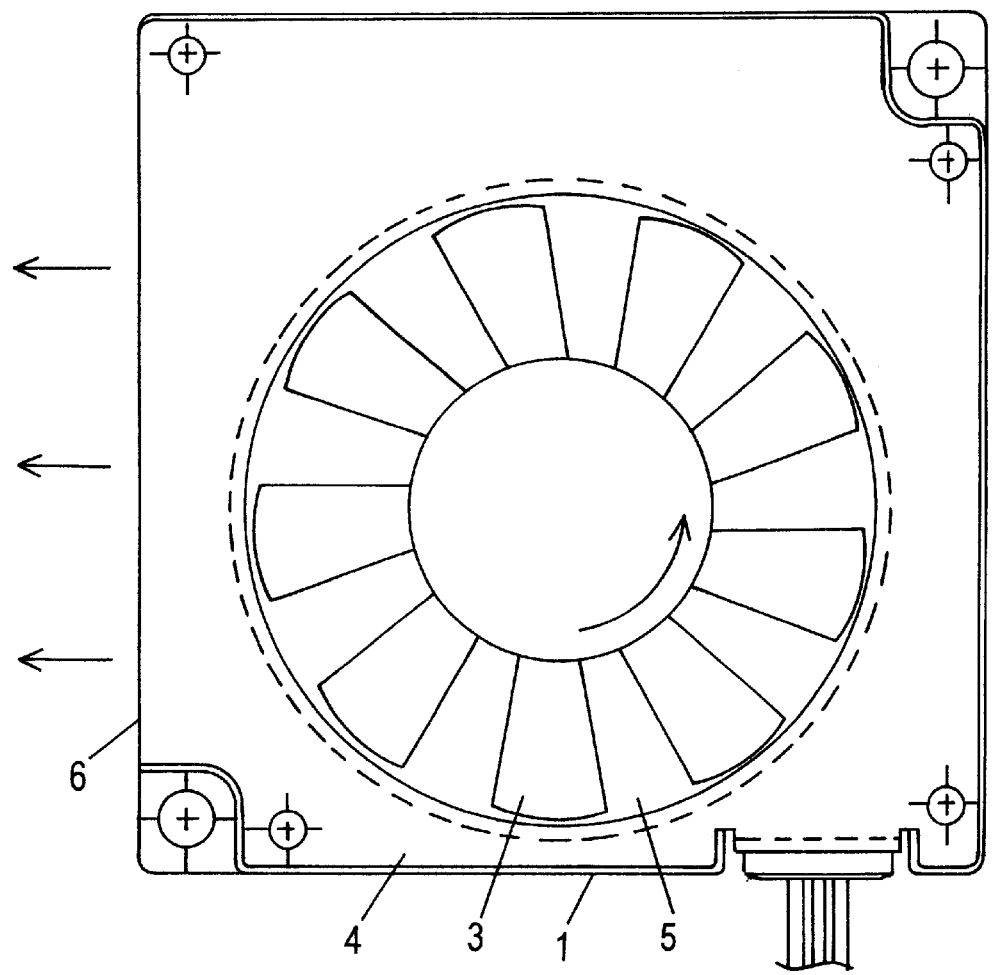
FIG. 7 is a plan view showing a heat sink unit of the prior art.
Figure 8:
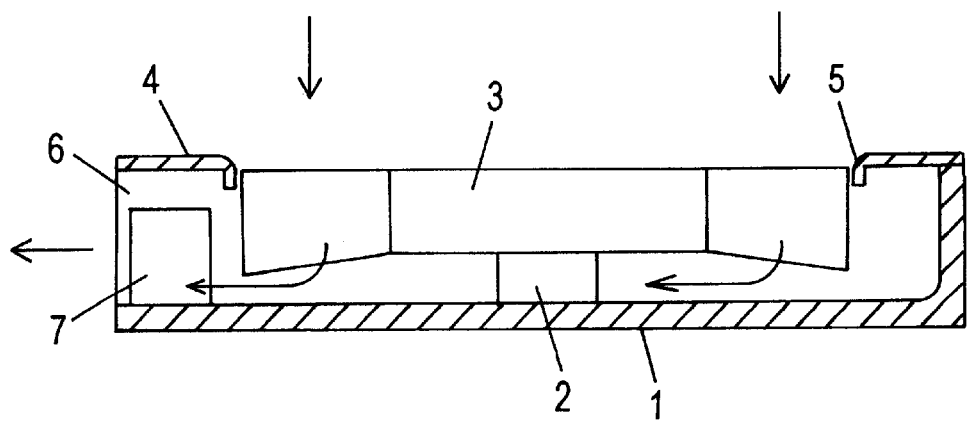
FIG. 8 is a cross sectional view showing the heat sink unit of the prior art.

Referring now to FIGS. 5A and 5B and FIG. 6, an electronic apparatus of an exemplary embodiment of this invention will be described.

Examples to be cited as the electronic apparatus are such ordinary electronic apparatuses as personal computer, car-navigation device, digital television receiver, and the like that are equipped with high-performance semiconductor devices (MPU, etc.).

FIGS. 5A and 5B illustrate how a heat sink unit is mounted to a circuit board according to this exemplary embodiments of the invention, and FIG. 6 is a sectional view showing an electronic apparatus in an exemplary embodiment of the invention.

Heat sink unit 53 is fixed to pin holders 54 and 55 (other two holders are not shown in FIGS. 5A and 5B) mounted to circuit board 51 with mounting pins 56 and 57 inserted through holes 20a and 22a in mounting tabs 20 and 22. Since base 25 is forced to contact with semiconductor device 52 such as a CPU mounted to the circuit board 51 by a thrusting force of springs on the mounting pins 56 and 57, heat of the semiconductor device 52 is conducted efficiently to fins 26 through the base 25. Although the mounting fixtures were provided at four locations in this exemplary embodiment, they could be arranged only at two locations or more as needed.

In FIG. 6, the heat sink unit 53 is so disposed and fixed that it comes in contact to the semiconductor device 52 on the circuit board 51, and that exhaust opening 16 of the heat sink unit 53 almost faces to an exhaust vent 50a of enclosure 50 of the electronic apparatus. Air heated by fin unit 17 of the heat sink unit 53 is blown out from the electronic apparatus, so as to avoid the electronic apparatus from being filled with the heated air, thereby attaining easily an efficient dissipation of the heat in the enclosure 50 of the electronic apparatus.

Because a thickness of the base 25 of the fin unit 17 is larger than a thickness of the substrate 11 in a manner that the base 25 protrudes from a bottom surface of the substrate 11, as shown in FIG. 5, heat of the semiconductor device 52 is easily conducted evenly throughout the base 25 and then to the fins 26. According to the foregoing structure of the present exemplary embodiment, since a bottom surface of a section where the motor unit 12 is mounted is elevated above an upper surface of the semiconductor device 52, flexibility in mounting electronic components 52a can be increased under the substrate 11, and thereby a degree of flexibility in designing the circuit board can also be increased.

Furthermore, additional gas can be drawn from the substrate 11 confronting the circuit board 51, when a centrifugal type fan 13 is used and an opening (not shown in the figure) is provided in the substrate 11 where the motor unit 12 is mounted, so as to dissipate heat of the electronic components on the circuit board 51. This increases a volume of gas flow in the heat sink unit 53, and smoothes the gas flow, and thereby improving the efficiency of heat dissipation of the heat sink unit 53.

Because an upper surface of the heat sink unit 53 is set lower at a side where the motor unit 12 is mounted than another side where the fin unit 17 is mounted, a proper space is maintained above the opening 15 for sufficient gas intake, even if other components contact to the heat sink unit 53 within the electronic apparatus.

An appropriate space is provided above the heat sink unit 53 as needed for air intake, if the upper surface of the heat sink unit 53 is equally level in height. A vent opening 99 may be provided in the enclosure 50 in an area facing the opening 15 of the heat sink unit 53, to directly draw-in external air, to deliver the external air to the fin unit 17, and to expel it after exchanging heat with the fin unit 17. The cooling effect for the semiconductor device 52 can be improved in this way.

What has been described in the foregoing embodiment is an example in which the heat sink unit has the cover. However, the cover becomes not necessarily required when optimizing a structure of the enclosure, e.g. a location of the exhaust opening, relative to an assembly of the heat sink unit in the electronic apparatus.

The foregoing description of the preferred embodiments of the invention has been presented for purposes of illustration and description. The above description is not intended to be exhaustive or to limit the invention to the precise form disclosed, and obviously many modifications and variations are possible in light of the above teaching. The scope of the invention is intended to be defined by the claims appended hereto.

What is claimed is:

1. A heat sink unit comprising:

a substrate having an opening formed therein;

a fan for supplying a gas flow to said substrate;

driving means for rotating said fan;

a fin extending through said opening of said substrate and attached to said substrate; and a cover attached to said substrate and providing a space between said substrate and said cover, wherein said fan, said driving means and said fin are arranged within said space, said cover has a first opening in a section facing said fan, and said substrate and said cover form a second opening at a side next to said fin.

2. The heat sink unit of claim 1, wherein a thickness of said substrate at a section where said fin is disposed is larger than a thickness of said substrate at a section where said fan is disposed.

3. The heat sink unit of claim 1, wherein a height from a bottom surface of said substrate to an upper surface of said cover at a section where said fin is disposed is larger than a height from the bottom surface of said substrate to the upper surface of said cover at a section where said fan is disposed.

4. The heat sink unit of claim 1, wherein a thickness of a base of said fin is larger than a thickness of said substrate, and said fin is disposed in a manner that the base protrudes from the bottom surface of said substrate.

5. The heat sink unit of claim 1, wherein said fan is disposed with the center of a rotary shaft of said fan apart from a centerline along a longitudinal direction of said heat sink substrate.

6. The heat sink unit of claim 1, wherein said fin is a separate body from said substrate.

7. The heat sink unit of claim 3, wherein a thickness of said substrate at a section where said fin is disposed is larger than a thickness of said substrate at a section where said fan is disposed.

8. The heat sink unit of claim 2, wherein a height from a bottom surface of said substrate to an upper surface of said cover at a section where said fin is disposed is larger than a height from the bottom surface of said substrate to the upper surface of said cover at a section where said fan is disposed.

9. The heat sink unit of claim 2, wherein a thickness of a base of said fin is larger than a thickness of said substrate, and said fin is disposed in a manner that the base protrudes from the bottom surface of said substrate.

10. The heat sink unit of claim 2, wherein said fan is disposed with the center of a rotary shaft of said fan apart from a centerline along a longitudinal direction of said heat sink substrate.

11. A heat sink unit according to claim 3, wherein said fin has a height which is greater than said height from the bottom surface of said substrate to the upper surface of said cover at a section where said fan is disposed.

12. A heat sink unit according to claim 3, wherein said fin and said substrate are made from different materials.

13. A heat sink unit comprising:
a substrate having an opening formed therein;
a fan for supplying a gas flow to said substrate;
driving means for rotating said fan;
a fin extending through said opening and attached to said substrate; and
a cover attached to said substrate and providing a space between said substrate and said cover,
wherein said fan, said driving means and said fin are arranged within said space,
said cover has a first opening in a section facing said fan,
said substrate and said cover form a second opening at a side next to said fin,
a height from a bottom surface of said substrate to an upper surface of said cover at a section where said fin is disposed is larger than a height from the bottom surface of said substrate to the upper surface of said cover at a section where said fan is disposed, and
a thickness of a base of said fin is larger than a thickness of said substrate, and said fin is disposed in a manner that the base projects from the bottom surface of said substrate.

14. The heat sink unit of claim 13, wherein said fin is a separate body from said substrate.

15. A heat sink unit according to claim 13, wherein said fin has a height which is greater than said height from the bottom surface of said substrate to the upper surface of said cover at a section where said fan is disposed.

16. A heat sink unit according to claim 13, wherein said fin and said substrate are made from different materials.

17. An electronic apparatus comprising:
an enclosure having an exhaust vent;
a circuit board disposed within said enclosure, said circuit board having a semiconductor device mounted thereon; and
a heat sink unit mounted on said semiconductor device,
wherein said heat sink unit comprises:
a substrate having an opening formed therein;
a fan for supplying a gas flow to said substrate;
driving means for rotating said fan; and
a fin extending through said opening and attached to said substrate, a thickness of a base of said fin being larger than a thickness of said substrate, said base protruding from a bottom surface of said substrate, and said base being in contact with said semiconductor device.

18. The heat sink unit of claim 17, wherein said fin is a separate body from said substrate.

19. The electronic apparatus of claim 17, wherein;
said heat sink unit further comprises a cover;
said fan and said driving means are arranged within a space formed between said cover and said substrate;
said cover has a first opening formed in a section facing said fan;
said heat sink unit has a second opening formed at one side of said substrate and said cover; and
said second opening faces said exhaust vent.

20. The electronic apparatus of claim 19, wherein said heat sink unit is configured so that a height from a bottom surface of said substrate to an upper surface of said cover at a section where said fin is disposed is larger than a height from the bottom surface of said substrate to the upper surface of said cover at a section where said fan is disposed.

21. The electronic apparatus of claim 19, wherein said enclosure has a second vent, and said first opening faces said second vent.

22. An electronic apparatus according to claim 20, wherein said fin has a height which is greater than said height from the bottom surface of said substrate to the upper surface of said cover at a section where said fan is disposed.

23. An electronic apparatus according to claim 20, wherein said fin and said substrate are made from different materials.

* * * * *